(12) United States Patent
Fliesler et al.

(10) Patent No.: US 6,238,975 B1
(45) Date of Patent: May 29, 2001

(54) METHOD FOR IMPROVING ELECTROSTATIC DISCHARGE (ESD) ROBUSTNESS

(75) Inventors: Michael David Fliesler, Santa Cruz; Mark W. Randolph, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/199,772

(22) Filed: Nov. 25, 1998

(51) Int. Cl.[7] .............................................. H01L 21/8247
(52) U.S. Cl. ............................................. 438/258; 438/529
(58) Field of Search ................................... 438/257–267, 438/529

(56) References Cited

U.S. PATENT DOCUMENTS

| | | | |
|---|---|---|---|
| 5,622,886 | 4/1997 | Allum et al. | 438/238 |
| 5,780,893 | 7/1998 | Sugaya | 257/318 |
| 5,930,628 | * 7/1999 | Chang | 438/258 |
| 6,004,843 | * 12/1999 | Huang | 438/241 |

FOREIGN PATENT DOCUMENTS

| | | |
|---|---|---|
| 43 33 768 | 4/1994 | (DE) . |
| 0 273 728 | 7/1988 | (EP) . |

* cited by examiner

*Primary Examiner*—Richard Booth
(74) *Attorney, Agent, or Firm*—Fliesler Dubb Meyer & Lovejoy LLP

(57) ABSTRACT

In a non-volatile memory comprising a region 2 for core memory cells and a peripheral region 4a on a substrate 6, a method for improving electrostatic discharge (ESD) robustness of the non-volatile memory comprises the steps of lightly doping the source and drain regions 18 and 20 of a peripheral transistor 12 in the peripheral region 4a with a first n-type dopant, providing a double diffusion implant mask 10 having an opening over the region 2 for the core memory cells and also an opening 8 over the peripheral region 4a, and performing a double diffusion implantation through the opening 8 over the peripheral region 4a. In an embodiment, the step of performing the double-diffusion implantation comprises the steps of implanting a second n-type dopant comprising phosphorus into the source and drain regions 18 and 20, and implanting a third n-type dopant comprising arsenic into the source and drain regions 18 and 20 subsequent to the step of implanting the second n-type dopant.

55 Claims, 3 Drawing Sheets

METHOD FOR IMPROVING ELECTROSTATIC DISCHARGE (ESD) ROBUSTNESS

TECHNICAL FIELD

The present invention relates to a method of improving electrostatic discharge (ESD) robustness in a semiconductor integrated circuit, and more particularly, to a method of improving ESD robustness in a non-volatile memory

BACKGROUND ART

Conventional non-volatile memory devices have long had problems in overcoming their susceptibility to damage by electrostatic discharge (ESD). Conventional ESD protection structures have been developed for non-volatile memory devices with some degree of ESD protection. For example, lightly doped drain (LDD) implant techniques have been developed to offer some degree of protection against ESD. However, the conventional LDD implant techniques are capable of offering only limited ESD protection and would not be able to meet stringent ESD robustness requirements. For example, it would be difficult for a conventional n-channel metal oxide semiconductor (NMOS) transistor with a lightly doped drain to meet voltage specifications of 2 kV in a human body model (HBM) and 1 kV in a charge device model (CDM).

Conventional medium doped drain (MDD) implant techniques have been developed to increase the ESD robustness of conventional MOS peripheral devices. However, conventional NMOS transistor devices produced by the conventional MDD implant techniques may have high input leakage currents with low breakdown voltages due to shortened channels caused by greatly increased lateral diffusion resulting from the conventional MDD implantation. Since the lateral diffusion may be very fast in a conventional MDD implant process, it may be difficult to control the effective channel length of the conventional NMOS transistors with MDD implant.

Other conventional techniques have been developed to control program and erase characteristics of non-volatile memory devices by applying additional process steps of implantation to change the doping profiles of the sources and the drains of the core memory cells. However, adding process steps to improve ESD robustness of peripheral MOS devices may adversely affect the performance and reliability of the core memory cells.

Therefore, there is a need for a method of improving the ESD robustness of a non-volatile memory device which offers a high degree of reliable ESD protection without an excessive leakage current. Furthermore, there is a need for a simplified process for improving the ESD robustness of a non-volatile memory device without affecting the doping profiles in the core memory cells

DISCLOSURE OF THE INVENTION

The present invention satisfies these needs In a non-volatile memory comprising a region for core memory cells and a peripheral region on a substrate, the peripheral region including source and drain regions of at least one transistor the source and drain regions of said at least one transistor separated by a channel region, a method according to the present invention for improving electrostatic discharge (ESD) robustness of the non-volatile memory generally comprises the steps of:

(a) lightly doping the source and drain regions with a first dopant;

(b) providing a double-diffusion implant mask having an opening over the region for the core memory cells and an opening over the peripheral region; and (c) performing a double-diffusion implantation through the opening over the peripheral region, the step of performing the double-diffusion implantation comprising the steps of:

(i) implanting a second dopant into the source and drain regions; and (ii) implanting a third dopant into the source and drain regions subsequent to the step of implanting the second dopant.

In an embodiment in which the transistor in the peripheral region comprises an n-channel metal oxide semiconductor (NMOS) transistors the first, second and third dopants comprise firsts second and third n-type dopants, respectively In a further embodiment, the second and third n-type dopants used in the step of performing the double diffusion implantation comprise phosphorus and arsenic, respectively. In yet a further embodiment, the second n-type dopant is implanted into the source and drain regions of the peripheral transistor with an implant dose in the range of about $3 \times 10^{15}$ cm$^{-2}$ to about $6 \times 10^{15}$ cm$^{-2}$, and the third n-type dopant is implanted into the source and drain regions with an implant dose in the range of about $1 \times 10^{14}$ cm$^{-2}$ to about $3 \times 10^{14}$ cm$^{-2}$.

In a further embodiment, the first dopant comprises phosphorus which is implanted into the source and drain regions with an implant dose on the order of about $3 \times 10^{15}$ cm$^{-2}$. In a further embodiment, the first n-type dopant is diffused into the source and drain regions to a depth on the order of about 0.2 $\mu$m. The double infusion implantation pushes the second and third n-type dopants slightly further into the source and drain regions of the substrates for example, to a depth on the order of about 0.23 $\mu$m.

In an embodiments the method according to the present invention further comprises the step of providing a gate oxide on the channel region of the substrate. In a further embodiment, the method further comprises the step of providing a gate on the gate oxide prior to the step of lightly doping the source and drains with the first dopant. In yet a further embodiment, the method further comprises the step of providing a spacer oxide surrounding the gate. The gate may be a polysilicon gate having a length on the order of about 1.1 $\mu$m, and the channel region may have an effective channel length of about 0.7 $\mu$m after the double diffusion implantation process is completed.

Advantageously, the present invention provides a method of improving the ESD robustness of a non-volatile memory to allow it to withstand a high-voltage electrostatic discharge. A further advantage of the present invention is that it is able to offer a high level of ESD protection without producing a high leakage current at a low breakdown voltage. Yet a further advantage of the present invention is that both the peripheral transistors and the core memory cells are subjected to the additional steps of double diffusion dopant implantation, thereby obviating the need for changing the doping profile of the sources and drains of the core memory cells solely for the purpose of ESD protection.

A further advantage of the present invention is that it uses an existing process and masking operations which was previously done specifically for the core memory cells, to improve also the ESD robustness of the peripheral transistors thereby obviating the need for additional processing and masking operations, which would otherwise add manufacturing cost and potentially decrease reliability of the core memory cells.

BRIEF DESCRIPTION OF THE DRAWINGS

The present invention will be described with respect to particular embodiments thereof, and references will be made to the drawings in which.

MODES FOR CARRYING OUT THE INVENTION

Figure 1:
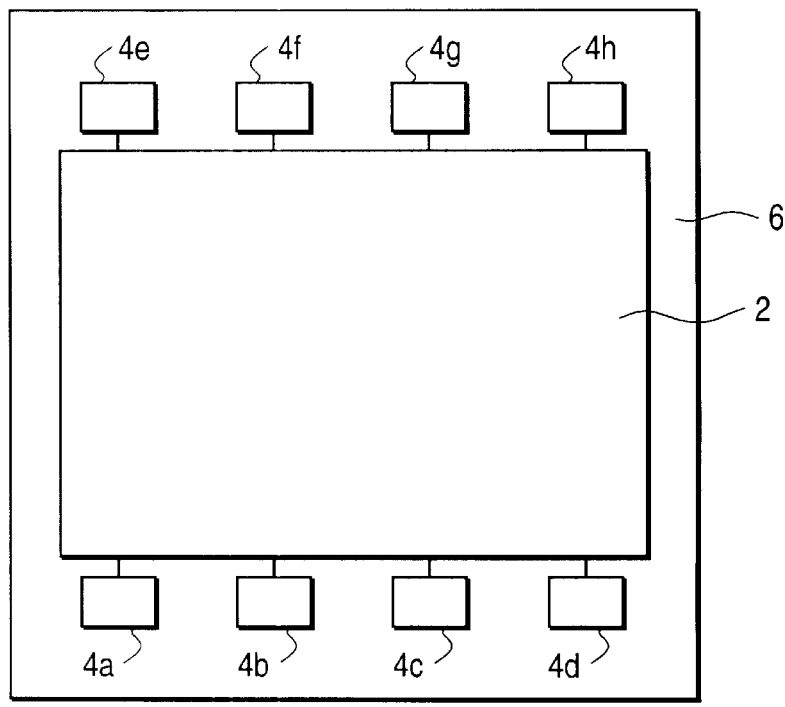
FIG. 1 is a simplified plan view showing a non-volatile memory with a region for core memory cells and peripheral regions on a substrate.

FIG. 1 shows a simplified plan view of a non-volatile memory which comprises a region 2 for an array of core memory cells (not shown) and a plurality of peripheral regions 4a, 4b, 4c . . . 4h on a single substrate 6. The region 2 for the core memory cells is an area of substrate 6 provided for the implementation of an array of memory cells, usually with a dual-gate structure comprising first and second polysilicon layers (POLY-1 and POLY-2) The peripheral regions 4a, 4b, 4c, . . . 4h are provided on the substrate 6 for the implementation of peripheral transistors such as input/output (I/O) transistors and transistors dedicated to the protection of internal transistors from electrostatic discharge (ESD). The transistors in the peripheral regions are usually single-gate metal oxide semiconductor (MOS) transistors In accordance with the method of the present inventions a double diffusion implant mask is provided with openings over the region 2 for the core memory cells and also has at least one opening over at least one of the peripheral regions 4a, 4b, 4c, . . . 4h such that a double diffusion implantation can be performed through the opening in the double diffusion implant mask on the selected peripheral region as well as on the region 2 for the core memory cells.

Figure 2:
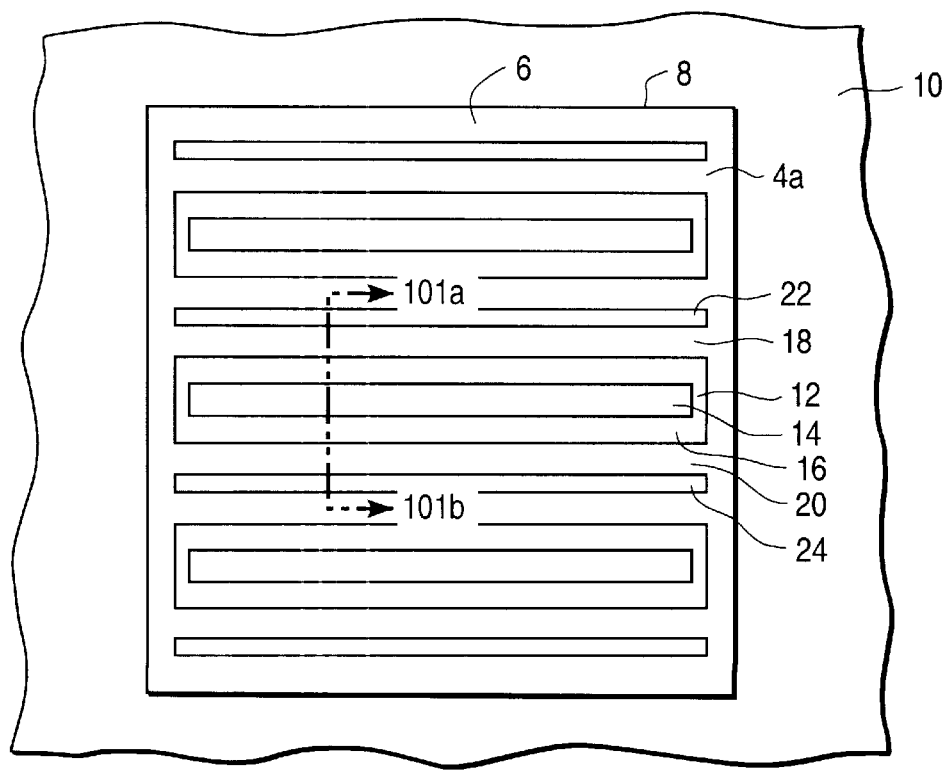
FIG. 2 is a simplified plan view of one of the peripheral regions with a plurality of transistors shown through an opening in a double diffusion implant mask which also has an opening over the region for the core memory cells.

FIG. 2 is a plan view of one of the peripheral regions, for examples peripheral region 4a, which is exposed through an opening 8 of a double diffusion implant mask 10. A plurality of MOS transistors, including an n-channel (NMOS) transistor 12, are provided in the peripheral region 4a. In the plan view shown in FIG. 2, the NMOS transistor 12 includes a gate 14, a spacer oxide 16 surrounding the gate 14, source and drain regions 18 and 20 in the substrate 6 implanted with n-type dopants, a source 22 and a drain 24.

Figure 3:
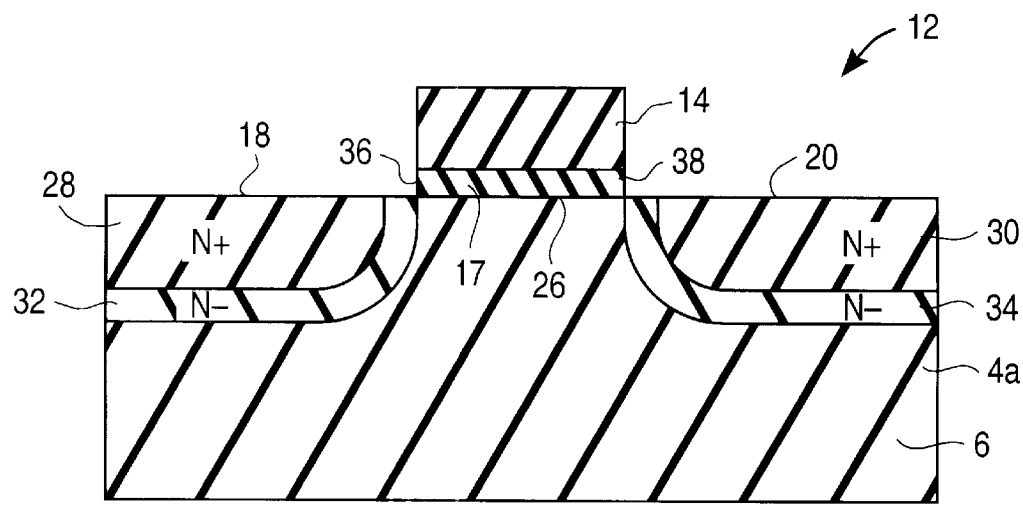
FIG. 3 is a sectional view, taken along the sectional line 101a–101b of FIG. 2, of source and drain regions of a transistor in the peripheral region before a spacer oxide is provided around the gate.

FIG. 3 shows a sectional view of the NMOS transistor 12 taken along the sectional line 101a–101b of FIG. 2, before the spacer oxide, the source and the drain are provided to complete the structure of the NMOS transistor 12, As shown in FIG. 3, a source region 18 and a drain region 20 are provided in the peripheral region 4a of the substrate 6 for the implantation of n-type dopants for the NMOS transistor 12. A channel region 26 is provided between the source and drain regions 18 and 20. Before the source and drain regions 18 and 20 are implanted with n-type dopants, a thin layer of a conventional gate oxide 17 is provided on top of the channel region 26 of the substrate 6, and a gate 14, such as a conventional polysilicon gate, is provided on top of the gate oxide layer 17. The gate oxide layer 17 and the polysilicon gate 14 may be provided on the channel region 26 of the substrate 6 by using conventional methods of deposition and etching known to a person skilled in the art.

After the gate oxide layer 17 and the polysilicon gate 14 are provided on the channel region 26 of the substrate 6, the source and drain regions 18 and 20 are lightly doped with a first n-type dopant. The first n-type dopant may be diffused into the N+ regions 28 and 30 of the source and drain regions 18 and 20, respectively, by using a conventional diffusion technique known to a person skilled in the art. In an embodiment, the first dopant is a relatively light n-type dopant such as phosphorus. In a further embodiment, the N+ regions 28 and 30 of the source and drain regions 18 and 20 are produced by diffusing phosphorus into the source and drain regions with an implant dose on the order of about $3\times10^{15}$ cm$^{-2}$. In yet a further embodiment, phosphorus is diffused into the N+ regions 28 and 30 to a depth on the order of about 0.2 μm.

In accordance with the present invention, a double diffusion implantation is performed in the source and drain regions 18 and 20 to produce double-diffusion implanted N– regions 32 and 34, respectively. The step of performing a double diffusion implantation comprises the steps of implanting a second n-type dopant into the source and drain regions 18 and 20, and implanting a third n-type dopant into the source and drain regions 18 and 20 subsequent to the step of implanting the second n-type dopant.

In an embodiment, the second dopant is a relatively light n-type dopant such as phosphorus, whereas the third dopant n-type dopant is a relatively heavy n-type dopant such as arsenic. In a further embodiments phosphorus is diffused into the source and drain regions 18 and 20 as the second n-type dopant in the double-diffusion implantation process with an implant dose in the range of about $3\times10^{15}$ cm$^{-2}$ to about $6\times10^{15}$ cm$^{-2}$. In yet a further embodiment, arsenic is diffused into the source and drain regions 18 and 20 as the third n-type dopant in the double-diffusion implantation process with an implant dose in the range of about $1\times10^{14}$ cm$^{-2}$ to about $3\times10^{14}$ cm$^{-2}$. Both the second and third n-type dopants may be implanted into the source and drain regions 18 and 20 to a depth on the order of about 0.23 μm. The additional doped source and drain regions produced by the double-diffusion implantation process according to the present invention beyond the depth of the N+ regions 28 and 30 are shown as N– regions 32 and 34, respectively.

By using phosphorus as the second n-type dopant and arsenic as the third n-type dopant in the double-diffusion implantation process, the doping profiles of the source and drain regions 18 and 20 may be controlled such that a desired amount of lateral diffusion and concentration in the N– regions 28 and 30 is produced underneath the gate oxide layer 17. Phosphorus, which is a relatively heavy n-type dopant material, is diffused through the source and drain regions 18 and 20 of the substrate 6 relatively vertically without significant lateral diffusion. On the other hand, arsenic, which is a relatively light n-type dopant material, diffuses quickly into the source and drain regions 18 and 20 of the substrate 6 and laterally underneath portions of the gate oxide layer 17 adjacent its lateral edges 36 and 38.

Because the polysilicon gate 14 and the gate oxide 17 are provided over the channel region 26 of the substrate 6 prior to the implantation of the first, second and the third n-type dopants into the source and drain regions 18 and 20, the polysilicon gate 14 and the underlying gate oxide 17 serve as an implant mask for the NMOS transistor 12, After the process steps of first lightly doping the source and drain regions with the first n-type dopant and then performing the double diffusion implantation with the second and third n-type dopants are completed, doping profiles for the source and drain regions 18 and 20 with N+ and N− regions as shown in FIG. 3 are produced.

Figure 4:
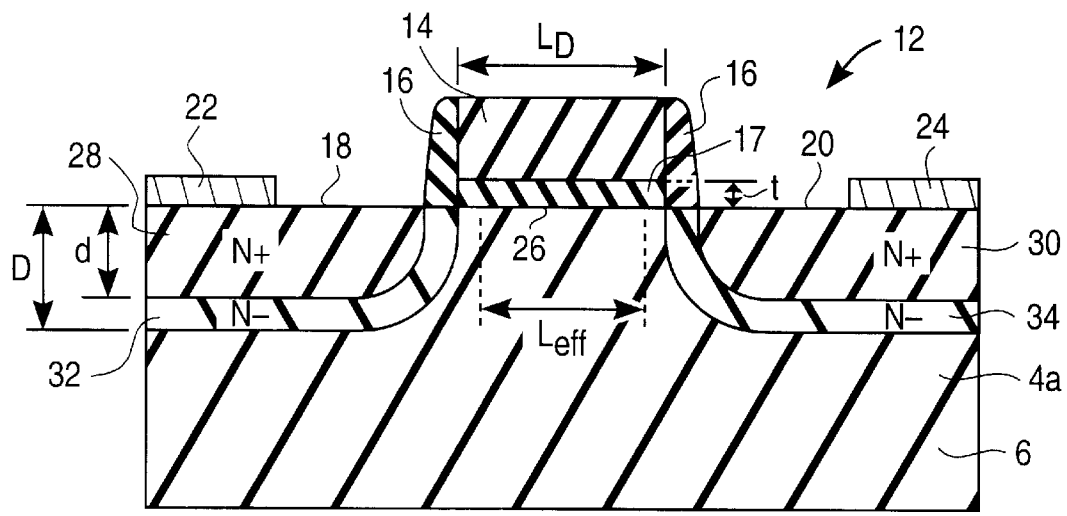
FIG. 4 is a sectional view of the transistor of FIG. 3 after the spacer oxides the source and the drain are provided.

FIG. 4 shows a sectional view of the NMOS transistor 12 of FIG. 3 after the spacer oxide 16 and the final arsenic source and drain implants into the source and the drain are provided. The source and drain are heavily doped N+ regions and feature metallic contacts 22 and 24 over the doped source and drain regions 18 and 20 of the substrate 6. The metallic contacts 22 and 24 may be fabricated by using conventional methods known to a person skilled in the art. The spacer oxide 16 is positioned around the gate 14 and the gate oxide layer 17, and is usually provided for submicron NMOS transistor devices. The spacer oxide 16 may be fabricated by using conventional methods known to a person skilled in the art.

FIG. 4 also shows dimensions of the physical gate length $L_D$, the effective channel length $L_{EFF}$, the thickness t of the gate oxide layer 17, the depth d of the N+ doped regions 28 and 30, and the depth D of the N− doped regions 32 and 34. Because of the controlled lateral diffusion produced by the double-diffusion implantation process, the effective channel length $L_{EFF}$ is somewhat less than the physical length $L_D$ of the gate 14. To compensate for the shorter channel effect of the double-diffusion implantation process, the physical gate length $L_D$ is increased in the layout of the NMOS transistor 12 to produce a desired effective channel length $L_{EFF}$ without adverse effects on reliability.

For example, to produce an effective channel length $L_{EFF}$ on the order of about 0.7 $\mu$m, the physical gate length $L_D$ may be increased by 0.4 $\mu$m over the effective channel length $L_{EFF}$. In this case, a length of 0.2 $\mu$m may be added to each side of the channel 26 with an effective channel length $L_{EFF}$ of 0.7 $\mu$m to produce a polysilicon gate with a physical length $L_D$ of about 1.1 $\mu$m. In an embodiment, the length of the polysilicon gate 14 itself is increased. The thickness t of the gate oxide layer 17 may be on the order of about 160 Å.

In an embodiment, the first n-type dopant comprising phosphorus is implanted into the N+ regions 28 and 30 with a relatively light implant dose on the order of about $3\times10^{15}$ cm$^{-2}$ to a depth D of about 0.2 $\mu$m below the surfaces of the source and the drain regions 18 and 20, respectively. In the double-diffusion implantation process, the second n-type dopant comprising phosphorus and the third n-type dopant comprising arsenic are implanted into the source and drain regions 18 and 20 to a depth D of about 0.23 $\mu$m, slightly greater than the implantation depth d of the first n-type dopant. The N− regions 32 and 34 of the respective source and drain regions 18 and 20 are implanted with the second and the third n-type dopants.

In an embodiment, the second n-type dopant comprising phosphorus is implanted into the source and drain regions 18 and 20 with an implant dose at least as much as the implant dose of phosphorus in the previous light doping process. Furthermore, the implant dose of the third n-type dopant comprising arsenic is greater than that of the second n-type dopant in the double diffusion implantation process. In a further embodiment, phosphorus is diffused as the second n-type dopant into the source and drain regions 18 and 20 with an implant dose in the range of about $3\times10^{15}$ cm$^{-2}$ to about $6\times10^{15}$ cm$^{-2}$ and arsenic is subsequently diffused as the third n-type dopant into the source and drain regions 18 and 20 with an implant dose in the range of about $1\times10^{14}$ cm$^{-2}$ to about $3\times10^{14}$ cm$^{-2}$.

Figure 5:
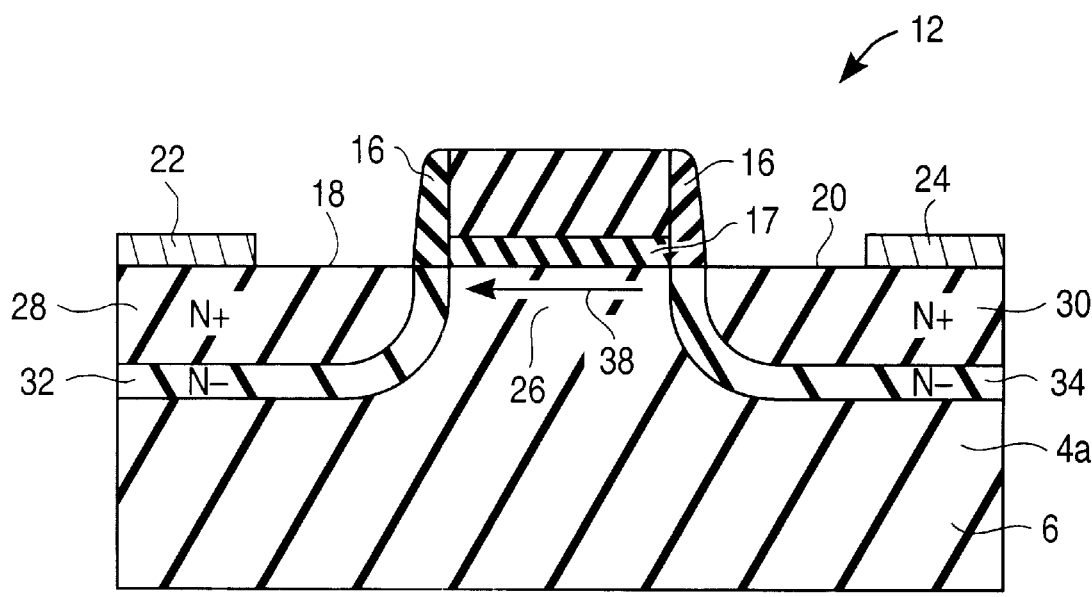
FIG. 5 is a sectional view of the transistor of FIG. 4, showing a lateral current flow from the drain region to the source region.

FIG. 5 is a sectional view of the NMOS transistor 12 of FIGS. 3 and 4 showing a lateral current 38 flowing across the channel 26 from the drain region 20 to the source region 18. The current 38 illustrates a parasitic lateral bipolar action in which the NMOS transistor 12 acts as if it is an npn bipolar transistor when it is protecting the internal MOS transistors from electrostatic discharge Because the transistors in the peripheral regions and the core memory cells are fabricated on the same substrate in a non-volatile memory, it would be inconvenient to fabricate a conventional bipolar transistor in the peripheral region to serve as an ESD protection transistor. An NMOS transistor fabricated according to the method of the present invention with the doping profiles as shown in FIGS. 3–5 and described above is capable of providing ESD protection for internal MOS transistors by acting as if it is an npn bipolar transistor after an avalanche breakdown After a high drain-to-source voltage $V_{DS}$ is applied across the drain 24 and the source 22 to produce a channel avalanche, a large drain-to-source current $I_{DS}$ is capable of flowing from the drain region 20 to the source region 18 through the channel 26 with little resistance Because the N− regions 32 and 34 are implanted with a relatively large dose of arsenic as the third n-type dopant in the double-diffusion implantation process according to the present invention, the doped source and drain regions 18 and 20 have relatively small lateral resistances When a high drain-to-source voltage $V_{DS}$ produced by an electrostatic discharge is applied across the drain 24 and the source 22 of the NMOS transistor 12, a large current flows laterally through the channel 26 while a smaller current flows vertically downward through the substrate 6. This vertical current through the substrate 6 is necessary to turn on the parasitic lateral bipolar transistor. Because of the small resistances in the source and the drain regions produced by the double-diffusion implantation process, subsequent current conduction is predominantly horizontal and relatively uniform across the channel 26. Although the effective channel length is shortened, the double diffusion of phosphorus and arsenic allows the lateral diffusion underneath the gate oxide 17 to be controllable so as to avoid an excessive leakage current at a low voltage. Furthermore, the small resistances of the double-diffused source and drain regions produce relatively little heat even though a large current flows across the source and drain regions, thereby avoiding excessive heating of the device.

INDUSTRIAL APPLICABILITY

The method of improving electrostatic discharge (ESD) robustness according to the present invention is applicable to a variety of non-volatile memories wherein the circuit elements of the peripheral transistors are sensitive to electrostatic discharge. The double diffusion implantation process is applied to I/O transistors and ESD transistors in one or more peripheral regions using the same mask as the one for the core memory cells. Furthermore, the double diffusion implant masks which has an opening over the region for the core memory cells and an additional opening over the selected peripheral region, need not be aligned with the circuit elements in the peripheral region with great precision. Because the mask alignment is non-critical, and no process changes are required for the core memory cells, the ESD robustness of the non-volatile memory can be improved without a significant increase in the complexity or cost of the fabrication process.

The invention has been described with respect to particular embodiments thereof, and numerous modifications can be made which are within the scope of the invention as set forth in the claims.

What is claimed is:

1. In a non-volatile memory comprising a region for core memory cells and a peripheral region on a substrate, the peripheral region including source and drain regions of at least one transistor, the source and drain regions of said at least one transistor separated by a channel region, a method for improving electrostatic discharge (ESD) robustness of the non-volatile memory comprising the steps of:
   (a) lightly doping the source and drain regions with a first dopant;
   (b) providing a double diffusion implant mask having an opening over the region for the core memory cells and an opening over the peripheral region; and
   (c) performing a double diffusion implantation through the opening over the peripheral region, the step of performing the double diffusion implantation comprising the steps of:
      (i) implanting a second dopant into the source and drain regions; and
      (ii) implanting a third dopant into the source and drain regions subsequent to the step of implanting the second dopant.

2. The method of claim 1, further comprising the step of providing a gate oxide on the channel region.

3. The method of claim 2, further comprising the step of providing a gate on the gate oxide prior to the step of lightly doping the source and drain regions with the first dopant.

4. The method of claim 3, further comprising the step of providing a spacer oxide surrounding the gate.

5. The method of claim 3, wherein the gate comprises a polysilicon gate.

6. The method of claim 3, wherein the gate has a length of about 1.1 $\mu$m, and the channel region has an effective channel length on the order of about 0.7 $\mu$m.

7. The method of claim 6, wherein the gate oxide has a thickness of about 160 Å between the gate and the channel region.

8. The method of claim 1, further comprising the step of providing a source over the source region and a drain over the drain region.

9. The method of claim 1, wherein said at least one transistor comprises an N-type metal oxide semiconductor (NMOS) transistor.

10. The method of claim 9, wherein the second dopant comprises phosphorus, and the third dopant comprises arsenic.

11. The method of claim 10, wherein the step of performing the double diffusion implantation comprises the step of implanting phosphorus and arsenic to a depth of about 0.23 $\mu$m.

12. The method of claim 10, wherein the second dopant has an implant dose in the range of about $3\times10^{15}$ cm$^{-2}$ to about $6\times10^{15}$ cm$^{-2}$.

13. The method of claim 10, wherein the third dopant has an implant dose in the range of about $1\times10^{14}$ cm$^{-2}$ to about $3\times10^{14}$ cm$^{-2}$.

14. The method of claim 9, wherein the first dopant comprises phosphorus.

15. The method of claim 14, wherein the first dopant has an implant dose of about $3\times10^{15}$ cm$^{-2}$.

16. The method of claim 14, wherein the step of lightly doping the source and drain regions with the first dopant comprises the step of diffusing phosphorus to a depth of about 0.2 $\mu$m.

17. A method for improving electrostatic discharge (ESD) robustness of a non-volatile memory comprising a region for core memory cells and a peripheral region on a substrate, the peripheral region including source and drain regions of at least one N-type metal oxide semiconductor (NMOS) transistor, the source and drain regions of said at least one NMOS transistor separated by a channel region, the method comprising the steps of:
   (a) lightly doping the source and drain regions with a first N-type dopant comprising phosphorus;
   (b) providing a double diffusion implant mask having an opening over the region for the core memory cells and an opening over the peripheral region; and
   (c) performing a double diffusion implantation through the opening over the peripheral region, the step of performing the double diffusion implantation comprising the steps of:
      (i) implanting a second N-type dopant comprising phosphorus into the source and drain regions; and
      (ii) implanting a third N-type dopant comprising arsenic into the source and drain regions subsequent to the step of implanting the second N-type dopant.

18. The method of claim 17, further comprising the step of providing a gate oxide on the channel region.

19. The method of claim 18, further comprising the step of providing a gate on the gate oxide prior to the step of lightly doping the source and drain regions with the first N-type dopant.

20. The method of claim 19, further comprising the step of providing a spacer oxide surrounding the gate.

21. The method of claim 19, wherein the gate comprises a polysilicon gate.

22. The method of claim 19, wherein the gate has a length of about 1.1 $\mu$m, and the channel region has an effective channel length on the order of about 0.7 $\mu$m.

23. The method of claim 22, wherein the gate oxide has a thickness of about 160 Å between the gate and the channel region.

24. The method of claim 17, further comprising the step of providing a source over the source region and a drain over the drain region.

25. The method of claim 17, wherein the second N-type dopant has an implant dose in the range of about $3\times10^{15}$ cm$^{-2}$ to about $6\times10^{15}$ cm$^{-2}$.

26. The method of claim 25, wherein the third N-type dopant has an implant dose in the range of about $1\times10^{14}$ cm$^{-2}$ to about $3\times10^{14}$ cm$^{-2}$.

27. The method of claim 26, wherein the step of performing the double diffusion implantation comprises the step of implanting phosphorus and arsenic to a depth of about 0.23 $\mu$m.

28. The method of claim 17, wherein the first N-type dopant has an implant dose of about $3\times10^{15}$ cm$^{-2}$.

29. The method of claim 28, wherein the step of lightly doping the source and drain regions with the first N-type dopant comprises the step of diffusing phosphorus to a depth of about 0.2 $\mu$m.

30. A method for improving electrostatic discharge (ESD) robustness of a non-volatile memory comprising a region for core memory cells and a peripheral region on a substrate, the peripheral region including source and drain regions of at least one N-channel metal oxide semiconductor (NMOS) transistor, the source and drain regions of said at least one NMOS transistor separated by a channel region, the method comprising the steps of:
   (a) providing a gate oxide on the channel region;
   (b) providing a gate on the gate oxide; and (c) lightly doping the source and drain regions with a first N-type dopant;

(d) providing a double diffusion implant mask having an opening over the region for the core memory cells and an opening over the peripheral region;

(e) performing a double diffusion implantation through the opening over the peripheral region, the step of performing the double diffusion implantation comprising the steps of:
  (i) implanting a second N-type dopant into the source and drain regions; and
  (ii) implanting a third N-type dopant into the source and drain regions subsequent to the step of implanting the second N-type dopant;

(f) providing a spacer oxide surrounding the gate; and (g) providing a source over the source region and a drain over the drain region.

31. The method of claim 30, wherein the gate comprises a polysilicon gate.

32. The method of claim 30, wherein the gate has a length of about 1.1 µm, and the channel region has an effective channel length on the order of about 0.7 µm.

33. The method of claim 32, wherein the spacer oxide has a thickness of about 160 Å between the gate and the channel region.

34. The method of claim 30, wherein the second N-type dopant comprises phosphorus, and the third N-type dopant comprises arsenic.

35. The method of claim 34, wherein the step of performing the double diffusion implantation comprises the step of implanting phosphorus and arsenic to a depth of about 0.23 µm.

36. The method of claim 35, wherein the step of lightly doping the source and drain regions with the first N-type dopant comprises the step of diffusing the first N-type dopant to a depth of about 0.2 µm.

37. The method of claim 34, wherein the second N-type dopant has an implant dose in the range of about $3 \times 10^{15}$ cm$^{-2}$ to about $6 \times 10^{15}$ cm$^{-2}$.

38. The method of claim 37, wherein the third N-type dopant has an implant dose in the range of about $1 \times 10^{14}$ cm$^{-2}$ to about $3 \times 10^{14}$ cm$^{-2}$.

39. The method of claim 34, wherein the first N-type dopant comprises phosphorus.

40. The method of claim 39, wherein the first N-type dopant has an implant dose of about $3 \times 10^{15}$ cm$^{-2}$.

41. In a non-volatile memory comprising a region for core memory cells on a substrate, a method for improving electrostatic discharge (ESD) robustness of the non-volatile memory comprising the steps of:

(a) providing a peripheral region separate from the region for the core memory cells on the substrate;

(b) providing source and drain regions for at least one N-type metal oxide semiconductor (NMOS) transistor in the peripheral region;

(c) providing a channel region for said at least one transistor between the source and drain regions;

(d) lightly doping the source and drain regions with a first N-type dopant;

(e) providing a double diffusion implant mask having an opening over the region for the core memory cells and an opening over the peripheral region; and (f) performing a double diffusion implantation through the opening over the peripheral region, the step of performing the double diffusion implantation comprising the steps of:
  (i) implanting a second N-type dopant into the source and drain regions; and
  (ii) implanting a third N-type dopant into the source and drain regions subsequent to the step of implanting the second N-type dopant.

42. The method of claim 41, further comprising the step of providing a gate oxide on the channel region.

43. The method of claim 42, further comprising the step of providing a gate on the gate oxide prior to the step of lightly doping the source and drain regions with the first N-type dopant.

44. The method of claim 43, further comprising the step of providing a spacer oxide surrounding the gate.

45. The method of claim 43, wherein the gate comprises a polysilicon gate.

46. The method of claim 43, wherein the gate has a length of about 1.1 µm, and the channel region has an effective channel length of about 0.7 µm.

47. The method of claim 46, wherein the gate oxide has a thickness of about 160 Å between the gate and the channel region.

48. The method of claim 41, further comprising the step of providing a source over the source region and a drain over the drain region.

49. The method of claim 41, wherein the second N-type dopant comprises phosphorus, and the third N-type dopant comprises arsenic.

50. The method of claim 49, wherein the step of performing the double diffusion implantation comprises the step of implanting phosphorus and arsenic to a depth of about 0.23 µm.

51. The method of claim 50, wherein the step of lightly doping the source and drain regions with the first N-type dopant comprises the step of diffusing the first N-type dopant to a depth of about 0.2 m.

52. The method of claim 49, wherein the second N-type dopant has an implant dose in the range of about $3 \times 10^{15}$ cm$^{-2}$ to about $6 \times 10^{15}$ cm$^{-2}$.

53. The method of claim 52, wherein the third N-type dopant has an implant dose in the range of about $1 \times 10^{14}$ cm$^{-2}$ to about $3 \times 10^{14}$ cm$^{-2}$.

54. The method of claim 49, wherein the first N-type dopant comprises phosphorus.

55. The method of claim 54, wherein the first N-type dopant has an implant dose of about $3 \times 10^{15}$ cm$^{-2}$.

* * * * *

UNITED STATES PATENT AND TRADEMARK OFFICE
CERTIFICATE OF CORRECTION

PATENT NO. : 6,238,975 B1
DATED : May 29, 2001
INVENTOR(S) : Michael David Fliesler et al.

Page 1 of 1

It is certified that error appears in the above-identified patent and that said Letters Patent is hereby corrected as shown below:

Column 9, claim 38,
Line 43, please delete "to about $3 \times 10^- cm^{-2}$" and insert -- to about $3 \times 10^{-14} cm^{-2}$ -- therefor.

Column 10, claim 51,
Line 46, please delete "to a depth of about 0.2m" and insert -- to a depth of about $0.2 \mu m$ -- therefor.

Signed and Sealed this

Eleventh Day of December, 2001

Attest:

*Nicholas P. Godici*

NICHOLAS P. GODICI
*Attesting Officer*         *Acting Director of the United States Patent and Trademark Office*